United States Patent
Astrom et al.

(10) Patent No.: US 8,442,156 B2
(45) Date of Patent: May 14, 2013

(54) ADAPTIVE IQ ALIGNMENT APPARATUS

(75) Inventors: Magnus Astrom, Lund (SE); David Franck Chappaz, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 1195 days.

(21) Appl. No.: 12/328,260

(22) Filed: Dec. 4, 2008

(65) Prior Publication Data

US 2009/0147886 A1    Jun. 11, 2009

(51) Int. Cl.
*H03K 9/06* (2006.01)
(52) U.S. Cl.
USPC ........... 375/322; 375/321; 375/316; 375/261; 375/268; 375/320; 375/269; 375/279; 375/329
(58) Field of Classification Search .................. 375/322, 375/321, 316, 261, 268, 320, 269, 279, 329
See application file for complete search history.

(56) References Cited

U.S. PATENT DOCUMENTS

| | | | | |
|---|---|---|---|---|
| 5,249,203 A | * | 9/1993 | Loper | 375/344 |
| 6,009,317 A | * | 12/1999 | Wynn | 455/296 |
| 7,233,624 B2 | * | 6/2007 | Kazakevich et al. | 375/243 |
| 2003/0007574 A1 | * | 1/2003 | Li et al. | 375/316 |
| 2003/0139167 A1 | | 7/2003 | Ciccarelli et al. | |
| 2004/0070239 A1 | | 4/2004 | Paulus | |
| 2004/0219884 A1 | | 11/2004 | Mo et al. | |
| 2006/0039506 A1 | * | 2/2006 | D'Alessandro | 375/324 |
| 2007/0280380 A1 | * | 12/2007 | Cho et al. | 375/332 |

FOREIGN PATENT DOCUMENTS

| | | |
|---|---|---|
| GB | 2414609 | 7/1998 |
| WO | WO98/32221 | 7/1998 |

OTHER PUBLICATIONS

Valkama et al. "Blind Signal Estimation in Conjugate Signal Models with Application to I/Q Imbalance Compensation", IEEE Signal Processing Letters, vol. 12, No. 11, Nov. 2005, 4 pages.

* cited by examiner

*Primary Examiner* — Zewdu Kassa
(74) *Attorney, Agent, or Firm* — RatnerPrestia

(57) ABSTRACT

A method and apparatus for aligning I- and Q-signals in a quadrature receiver based on an squared signal. A correction is evaluated in an iterative manner by finding an average of the squared signal. The average squared signal may be the received signal, in which case the iterations are applied in a feed forward manner. Alternatively, the average squared signal is the aligned signal in which case the iterations are applied in a feed back manner. The correction may include the evaluation of an normalization or, in the feed back case, this can be implicitly included in the manner in which the iteration is applied. Various parameters to the iteration can be set to accommodate the operating environment of the receiver and characteristics of the received signal.

29 Claims, 7 Drawing Sheets

US 8,442,156 B2

ADAPTIVE IQ ALIGNMENT APPARATUS

CROSS-REFERENCE TO RELATED APPLICATIONS

This application claims priority to United Kingdom Application No. 0723892.6 filed Dec. 6, 2007. The content of which is hereby incorporated by reference in its entirety.

TECHNICAL FIELD

This invention relates to an apparatus and a method for adaptive IQ alignment. In particular, the invention relates to blind adaptive IQ alignment.

BACKGROUND TO THE INVENTION

Data transmission may rely on the use of a modulation scheme to modulate a carrier wave. Quadrature modulation modulates the carrier wave according to a symbol alphabet defined on a constellation diagram. The constellation diagram is a representation of the interaction between orthogonally defined inphase and quadrature signals (or I- and Q-signals) applied to the carrier wave during transmission.

When the transmitted signal is received, it is necessary to demodulate the signal. To derive the I-signal, the incoming signal is multiplied by a $\cos(2\pi f_c t)$ signal and to obtain the Q-signal, the incoming signal is multiplied by a $\sin(2\pi f_c t)$ signal, where $f_c$ is the frequency of the carrier wave. The received symbols are determined by the interactions of these received I- and Q-signals.

FIG. 1 illustrates an I/Q plane in which circle 10 represents the location of an ideal received signal, modulated by Quadrature Phase-Shift Keying (QPSK). As the amplitude of each of the symbols is equal and, for each symbol, the I- and Q-signals are orthogonal, the area 10 is a circle.

In practice however, there are a number of factors which affect the amplitude and phase of the I- and Q-signals and which result in a misalignment between these signals. FIG. 2 illustrates an I/Q plane in which ellipse 12 represents the location of a received and processed signal modulated by QPSK. Due to the misalignment between the I- and Q-signals amplitude variations result in a distortion of the radius and phase variations result in I- and Q-axes which are not orthogonal to one another as represented in FIG. 2. Although the I/Q planes illustrated in FIGS. 1 and 2 relate to signals modulated by QPSK, similar IQ misalignment issues exist in other quadrature modulation schemes.

FIG. 3 illustrates a portion of a quadrature receiver 20 of a type known in the art. The receiver 20 includes an antenna 22 for receiving an incoming signal. The received signal is amplified by an amplifier 24 and then follows two parallel signal paths. A local oscillator 30 produces a $\cos(2\pi f_c t)$ signal which is applied to the incoming signal by mixer 28. A $\pi/2$ phase-shifting device 32 alters the signal produced by the oscillator 30 to a $\sin(2\pi f_c t)$ signal which is then applied to the received signal by mixer 26. The incoming signal multiplied by the $\cos(2 f_c t)$ signal is passed through low-pass filter 34 and amplifier 36 to derive the I-signal. The incoming signal multiplied by the $\sin(2\pi f_c t)$ signal is passed through low-pass filter 38 and amplifier 40 to derive the Q-signal.

Within the receiver 20, imbalances in the amplifiers 36 and 40 introduce an error into the amplitudes of the received symbols, whereas imperfections in phase shifting device 32 introduce an error into the phases of the received symbols.

A misalignment in the I- and Q-signals may increase the bit error rate of the demodulated signal. It is therefore desirable to properly align the I- and Q-signals.

There are at least two methods for realigning misaligned I- and Q-signals. In the first known method, a training or pilot signal is used during a calibration sequence and the received I- and Q-signals are aligned with reference to the calibration. The use of training or pilot signals does not however compensate for additional IQ misalignment which occurs after the calibration sequence has been completed. An example of this type of alignment is disclosed in US 2004/0219884.

In the second known method, referred to as "blind" IQ alignment, only the received signal is available for IQ alignment. At the root of many blind IQ alignment methods lies the realisation that the received signal can be viewed as a combination of an ideal signal (in which the I- and Q-signals are aligned) and a complex conjugate of the ideal signal. In this case certain á priori properties of the signal are used to correct the misalignment.

For example, Valkama, M. and Renfors, M. "Blind Signal Estimation in Conjugate Signal Models with Application to I/Q Imbalance Compensation", IEEE Signal Processing Letters, Volume 12, No. 11, November 2005 discloses a matrix-representation of received and ideal signals, and their complex conjugates, and the use of matrix algebra to derive an iterative technique to apply a whitening transformation which aligns the I- and Q-signals. However the use of such matrix techniques can be computationally intensive and complex.

SUMMARY OF THE INVENTION

According to a first aspect, the invention provides for a method of correcting a misalignment between an I-signal and a Q-signal in a received signal, the method comprising the steps of:

(a) determining an error factor based on a squared signal;
(b) determining a correction factor based on the error factor; and
(c) applying the correction factor to the received signal to produce a corrected signal.

As the correction factor is based on the error factor which is in turn based on a squared signal, embodiments of the invention provide for a method of aligning the I- and Q-signals which is less computationally intensive and complex than known methods and which is relatively easy to implement.

The correction factor may include a normalisation and the normalisation may be based on a squared magnitude of the signal. Preferably, the normalisation relates to an average energy per sample.

Step (a) may include the step of deriving the average of the squared signal. By considering the average squared signal, the accuracy of the evaluation of the IQ misalignment is increased.

Step (a) may include the step of summing the squared signal over an integration length, said integration length comprising a predetermined number of samples.

The integration length may be dependent upon a block length or a burst length of the received signal. By setting the integration length dependent upon a block or burst length, the alignment of the I- and Q-signals can be constrained to those portions of the signal in between blocks or bursts, thereby minimising interference with the data of the block or burst.

The evaluation of the correction factor may be dependent on the integration length.

Step (a) may include the step of adding every $m^{th}$ sample wherein m is equal to, or greater than, one to determine the average squared signal.

The correction factor may be applied to the complex conjugate of the received signal and the result thereof subtracted from the received signal to produce the corrected signal.

Step (a) may comprise the step of evaluating only the real or the imaginary part of the average squared signal.

The real part of the average squared signal is related to the error in the amplitude, whereas the imaginary part of the average squared signal is related to the error in the phase. For modulation schemes where errors in amplitude do not affect symbol interpretation (e.g. QPSK), it is sufficient to consider the error in phase only. In this case, it is sufficient to only evaluate the imaginary portion of the average squared signal.

Similarly, where errors in phase do not affect symbol interpretation, it is sufficient to only evaluate the real part of the average squared signal.

For modulation schemes where it is necessary to consider errors in both phase and amplitude (e.g. QAM), these may be evaluated independently in embodiments according to the invention. By evaluating the imaginary and real portions of the signal independently, the invention may be implemented relatively easily and cheaply, only requiring a few multipliers, adders and shift operations. Additionally, the speed of the implementation may be improved by implementing the more computationally intensive operations in hardware and the less complex computations in software.

The correction factor may be iteratively updated. The iterative updating of the correction factor may continue indefinitely, may terminate after a predetermined number of iterations or may terminate once a correction factor of an iteration is sufficiently similar to a correction factor of a previous iteration. Preferably, the correction factor is iteratively updated until a normal value of a difference between a correction factor of an iteration and a correction factor of a previous iteration is less than a predetermined value. By limiting the number of iterations, current may be conserved.

The correction factor of a particular iteration may be based on the correction factor of a previous iteration and a re-evaluated error factor.

The correction factor of a particular iteration may be related to the correction factor of a previous iteration by a multiplicative factor and said multiplicative factor may be dependent on one or more of: an operating environment, an integration length and a signal amplification.

Where the multiplicative factor is dependent upon the operating environment it may compensate for variations attributable to one or more of: operating temperature, equipment age and sampling frequency.

The squared signal may be a square of an incoming signal and the iteration may then be applied in a feed forward manner.

The correction factor for a particular iteration $\hat{c}(k)$ may then be updated according to:

$$\hat{c}(k)=(1-\mu)\hat{c}(k-1)+\mu\Delta\hat{c}(k)$$

where $\mu$ is the multiplicative factor and $\Delta\hat{c}(k)$ is the error factor.

The error factor $\Delta\hat{c}(k)$ may be evaluated according to:

$$\Delta\hat{c}(k) = \frac{\sum_{n=N(k-1)+1}^{Nk} X^2(n)}{2\sum_{n=N(k-1)+1}^{Nk} |X(n)|^2}$$

where X is the received signal and N is an integration length.

Alternatively, the squared signal may be a square of an aligned signal and the iteration may then be applied in a feed back manner.

The correction factor for a particular iteration $\hat{c}'(k)$ may then be evaluated according to:

$$\hat{c}'(k)=\hat{c}'(k-1)+\mu'\Delta\hat{c}'(k)$$

where $\mu'$ is the multiplicative factor and $\Delta\hat{c}'(k)$ is the error factor.

The error factor $\Delta\hat{c}'(k)$ may be evaluated according to:

$$\Delta\hat{c}'(k) = \frac{\sum_{n=N(k-1)+1}^{Nk} Y^2(n)}{2\sum_{n=N(k-1)+1}^{Nk} |Y(n)|^2}$$

where Y is the aligned signal and N is an integration length.

Where the iteration is applied in a feedback manner, normalisation of the signal may be accounted for in the multiplicative factor and the error factor $\Delta\hat{c}'(k)$ may then be evaluated according to $$\Delta\hat{c}'(k) = \sum_{n=N(k-1)+1}^{Nk} Y^2(n)$$

According to a further aspect, the invention provides for a method of correcting a misalignment between an I-signal and a Q-signal in a received signal which includes the steps of:
(a) determining a correction factor based on the misalignment between said I-signal and said Q-signal;
(b) applying the correction factor to the received signal to produce a corrected signal; and
(c) establishing a correlation between said determined correction factor and one or more operational parameters; and
(d) storing said determined correction factor for future use.

The correction factor may be determined in the manner described herein.

The method may further comprise the step of monitoring one or more operational parameters, and, on detection of a change in said operational parameter, using a previously stored correction factor to produce said corrected signal.

Said one or more optional parameters may include one or more of: a signal frequency, a signal amplification, a sampling frequency, or an operating temperature.

According to a further aspect, the invention provides for means for correcting a misalignment between an I-signal and a Q-signal in a received signal adapted to perform the method as hereinbefore described.

According to a further aspect, the invention provides for a quadrature receiver comprising said means for correcting a misalignment between an I-signal and a Q-signal in a received signal.

BRIEF DESCRIPTION OF THE DRAWINGS

Further features and advantages of the present invention will become apparent from the following description of embodiments thereof, presented by way of example, and by reference to the accompanying drawings, wherein like reference numerals refer to like parts, and where.

DESCRIPTION OF PREFERRED EMBODIMENTS

Figure 4:
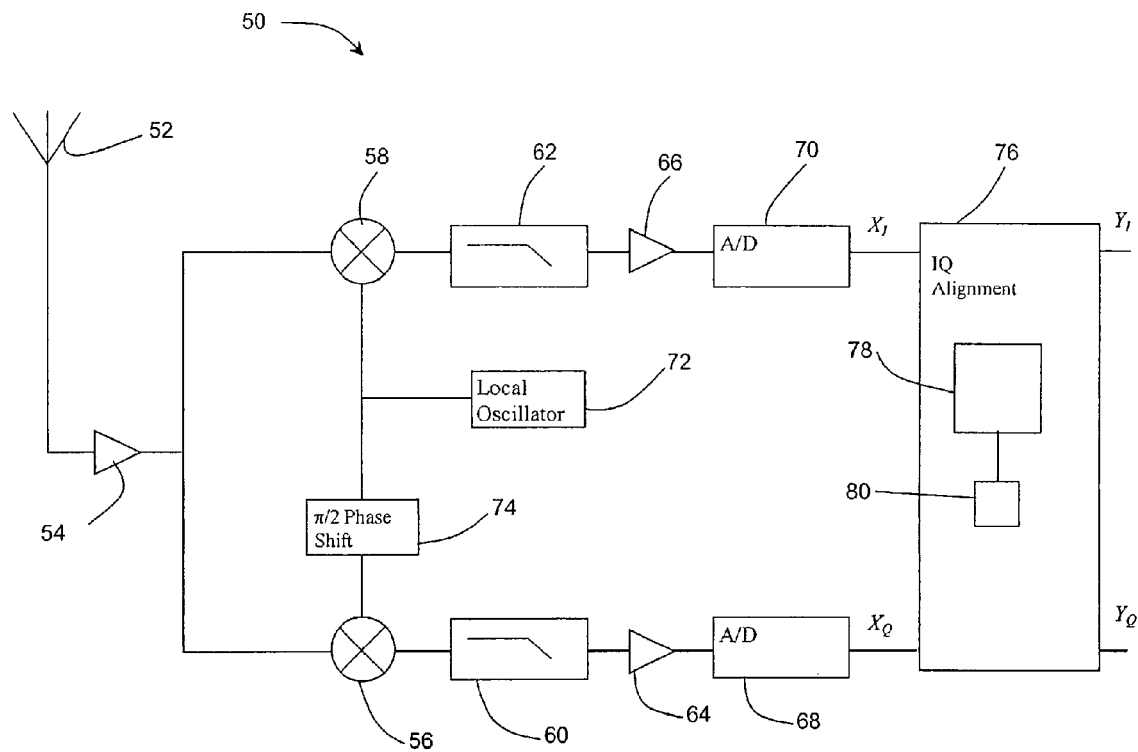
FIG. 4 is a schematic representation of a radio receiver suitable for implementing embodiments of the invention.

FIG. 4 schematically illustrates a radio receiver 50 which includes an antenna 52 for receiving radio frequency signals. The signals pass through an amplifier 54 connected to antenna 52. Two parallel signal paths comprising respective mixers 56, 58, low-pass filters 60, 62, amplifiers 64, 66 and analogue-to-digital converters 68, 70 are connected to the amplifier 54. A local oscillator 70 is connected to mixer 58 and via a π/2 phase shifting device 74 to mixer 56. The two parallel paths are connected to an IQ alignment device 76.

The local oscillator 70 applies a $\cos(2\pi f_c t)$ signal to mixer 58 and, via π/2 phase shifting device 74, a $\sin(2\pi f_c t)$ signal to mixer 56. In this manner the I-signal is derived from the path through filter 62, amplifier 66 and analogue-to-digital converter 70 to IQ alignment device 76 and the Q-signal derives from the path through filter 60, amplifier 64 and analogue-to-digital converter 68 to the IQ alignment device 76. The IQ alignment device 76 comprises a microprocessor 78 connected to a memory 80.

Figure 1:
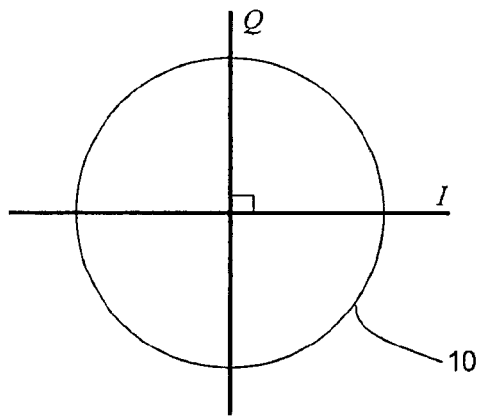
FIG. 1 is a representation of an I/Q plane for an ideal, aligned signal.
Figure 2:
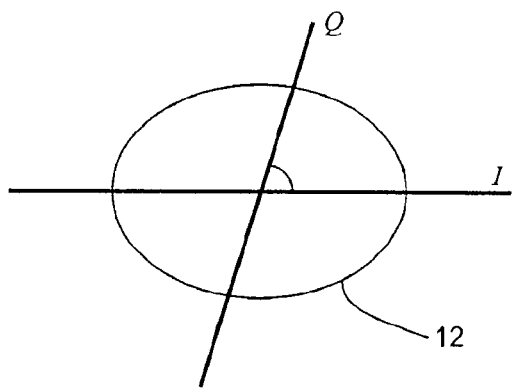
FIG. 2 is a representation of the I/Q plane for a misaligned signal.
Figure 3:
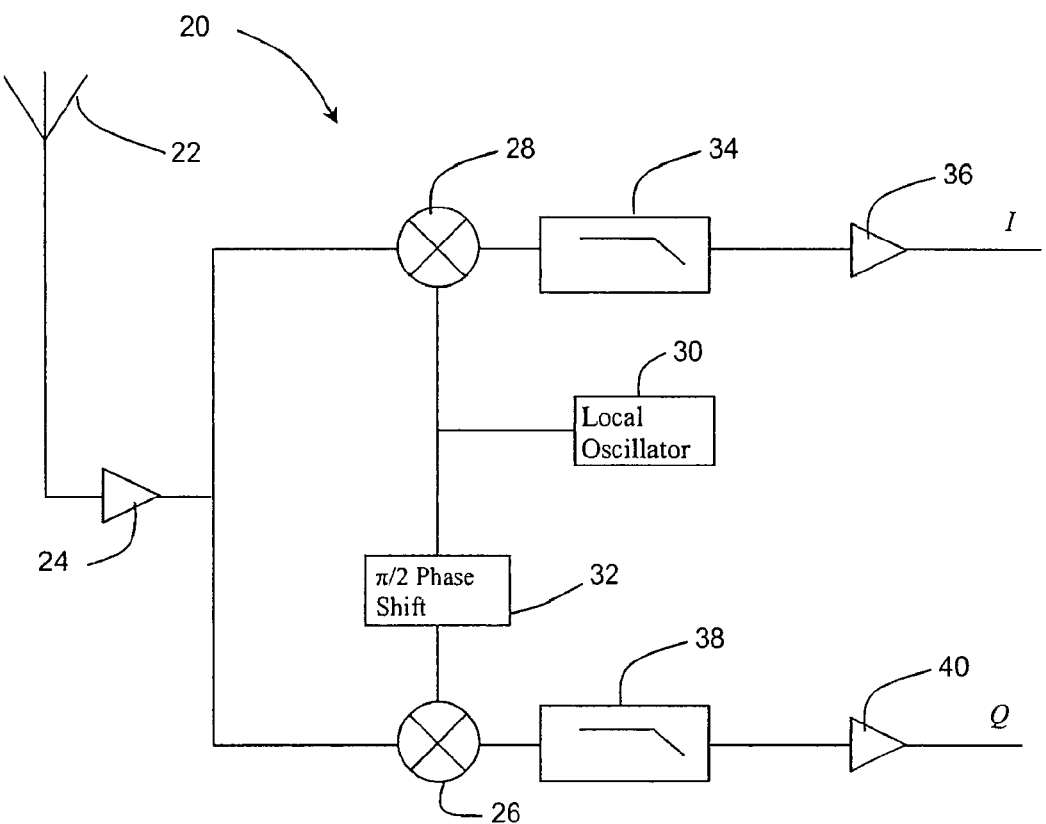
FIG. 3 is a schematic representation of a front-end of a radio receiver illustrating sources of IQ misalignment.

As described above with reference to FIG. 3, IQ misalignment arises due to imbalances between amplifiers 64 and 66, and imperfections in the phase shifting device 74. The microprocessor 78 of the I/Q alignment device 72 compensates for the misalignment in the I- and Q-signals according to one of the embodiments of the invention in the manner described below.

Figure 5:
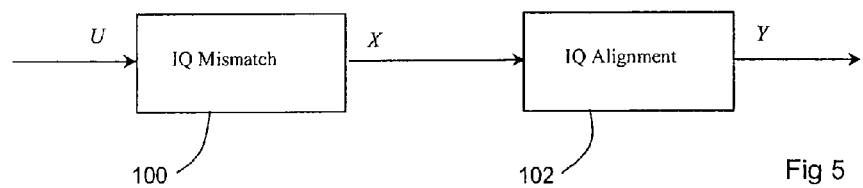
FIG. 5 is a schematic representation of IQ misalignment and subsequent alignment.

FIG. 5 is a schematic representation of the IQ misalignment and re-alignment of a signal. An ideal signal U undergoes an IQ mismatch at block 100 to produce the received signal X. The received signal X then undergoes an IQ alignment, represented by box 102, to produce the aligned signal Y. With reference to FIG. 4 the IQ mismatch 100 occurs in the receiver 50 as described, and IQ alignment 102 is performed by the IQ alignment device 76.

The received signal X can be considered to have a component comprising the ideal signal U added to a component comprising the complex conjugate of the ideal signal U. Therefore:

$$X = aU + bU^* \quad (1)$$

Similarly, the aligned signal Y can be considered as the received signal X less a portion of the complex conjugate of the received signal X*:

$$Y = X - cX^* \quad (2)$$

The relation between U and Y in terms of X can be expressed as follows:

$$Y = X - cX^* = (a - cb^*)U + (b - ca^*)U^* \quad (3)$$

The objective is to find an estimate Y, which removes the complex conjugate component U* to thereby retain the ideal signal U.

Setting:

$$c = \frac{b}{a^*} \quad (4)$$

satisfies these conditions.

However, a and b are unknown parameters based respectively on the amplitude and phase mismatches Δα and Δφ. It is therefore necessary to derive an estimate of c.

Squaring equation (1) results in:

$$X^2 = a^2 U^2 + b^2 U^{*2} + 2abUU^* \quad (5)$$

which has the expectancy:

$$E[X^2] = a^2 E[U^2] + b^2 E[U^{*2}] + 2abE[|U|^2] \quad (6)$$

Then, taking into consideration that, for a normalised mismatch model $E[|X|^2] = E[|U|^2]$ and, for an ideal signal $E[U^2] = 0$, equations (4) and (6) are combined so that:

$$E[X^2] = 2|a|^2 cE[|X|^2] \quad (7)$$

For practical purposes, the error in the amplitude Δα is small, as is the error in the phase, Δφ. Therefore $|a|^2 \approx 1$, in which case, equation (7) can be reformulated to:

$$c = \frac{E[X^2]}{2E[|X|^2]} \quad (8)$$

Considering equation (8), an estimate of c, ĉ (referred to herein as the correction factor), is expressed as:

$$\hat{c} = \frac{\overline{X^2}}{2\overline{XX^*}} \quad (9)$$

where $\overline{X^2}$ and $\overline{XX^*}$ are ensemble averages of $X^2$ and $XX^*$, respectively. If the matter is considered iteratively, this can be expressed as:

$$\hat{c}(n) = (1 - \mu)\hat{c}(n-1) + \mu \frac{\overline{X^2(n)}}{2\overline{X(n)X^*(n)}} \quad (10)$$

such that:

$$\lim_{n \to \infty} \hat{c}(n) = \frac{E[X^2]}{2E[|X|^2]} \quad (11)$$

Therefore, in equation (10), μ is a multiplicative factor governing the rate of change of ĉ(n) from one iteration to the next.

Considering block based adaptation where for a given iteration k, the estimated correction factor ĉ is only updated every N samples, equation (10) is expressed as:

$$\hat{c}(k)=(1-\mu)\hat{c}(k-1)+\mu\Delta\hat{c}(k) \quad (12)$$

where the error factor $\Delta\hat{c}(k)$ is defined as:

$$\Delta\hat{c}(k) = \frac{\sum_{n=N(k-1)+1}^{Nk} X^2(n)}{2\sum_{n=N(k-1)+1}^{Nk} |X(n)|^2} \quad (13)$$

for integer k>0. In the first block, i.e. where k=0, the assumption is made that ĉ(0)=0. Alternatively, the initial value of the correction factor may be retrieved from a memory store as described below.

Equation (13) expresses the error factor $\Delta\hat{c}(k)$ as the average squared signal divided by the average squared magnitude of the signal. It will be realised that the number of samples used to derive the average, N, will cancel out of the numerator and the denominator.

As the value of the multiplicative factor μ governs the rate at which ĉ(k) will change from one iteration to the next, this value is chosen to ensure that various operational parameters are accounted for. Specifically, the value of the integration length N and the accuracy of the ensemble averages will influence the value of the multiplicative factor. If the integration length is relatively long, and the ensemble averages accurate, the value of μ will be closer to 1. However, if the integration length is relatively short, or the ensemble averages unreliable, the value of μ will be closer to 0.

Figure 6:
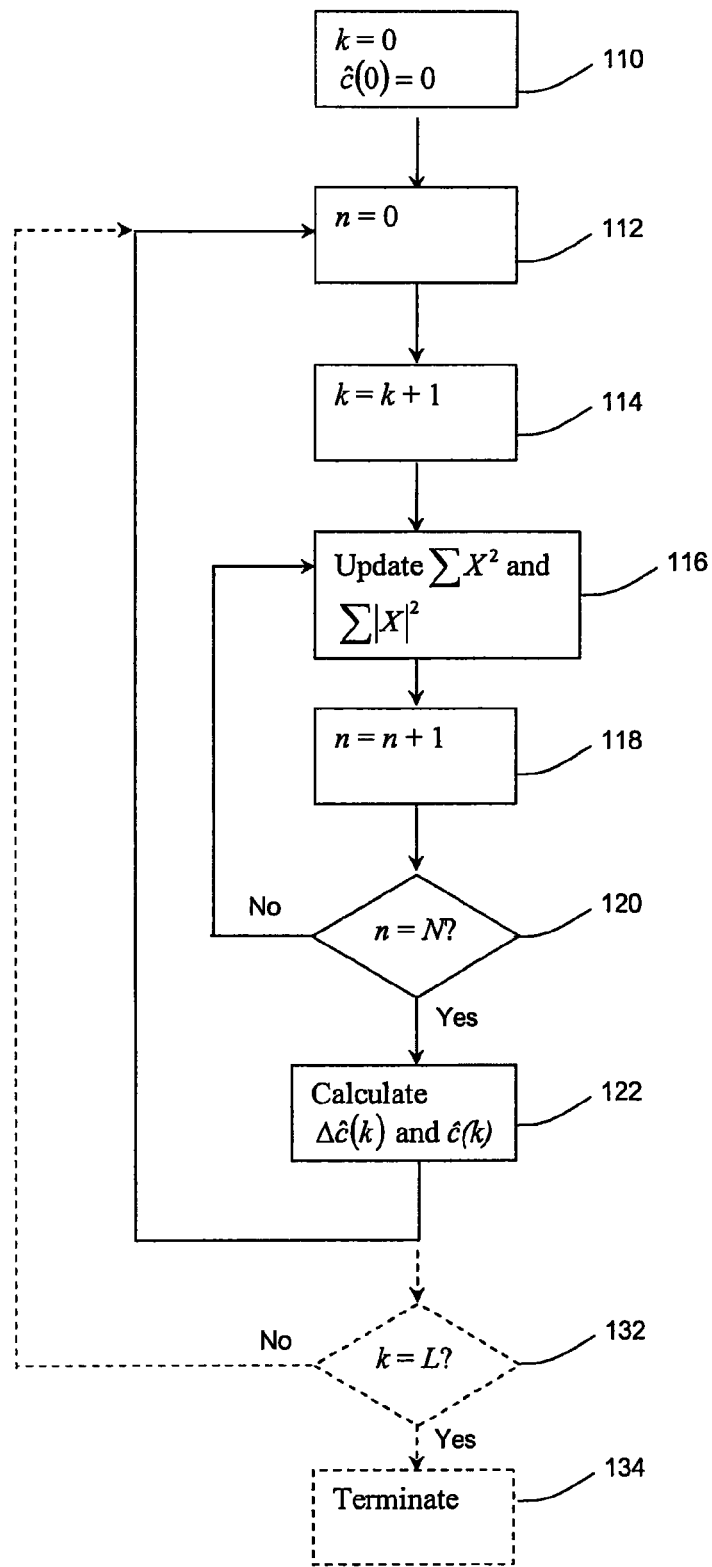
FIG. 6 is a flow diagram representing the operation of a first embodiment of the invention operating in a feed forward manner.

FIG. 6 is a flow diagram representing the algorithm of equations (12) and (13) implemented by a processor in the IQ alignment device 72 illustrated in FIG. 4. As inputs to the algorithm, the values of N, the number of samples over which the signal is averaged according to equation (13) and μ, the multiplicative factor of equation (12), are set.

Block 110 represents an initialisation of the algorithm where k is set to zero, as is the initial value of the correction factor ĉ(0). The process then moves to block 112 where variable n, over which the sums of equation (13) are taken is also set to 0. In the next block, block 114, the value of k is incremented by 1 after which, in block 116, the numerator and denominator of equation (13) are updated for the new sample X(n) for the current value of n. Therefore block 116 represents sampling and calculation processes which are repeated for each value of n.

At block 118, the value of n is incremented. In block 120, the now-incremented value of n is compared to the value of N (the chosen number of samples over which to perform the averaging process). If n does not equal N, the process returns to block 116 to again update the numerator and denominator of equation (13) with the incremented value of n and add the result to the previous respective values of the numerator and denominator calculated for the previous value of n. Alternatively, if n equals N, the process continues to block 122 where the value of $\Delta\hat{c}(k)$ is calculated based on the current values of the numerator and denominator in equation (13) established in block 116 for n=N. The value of $\Delta\hat{c}(k)$ is then used at block 122 to evaluate ĉ(k) according to equation (12).

Once the value of ĉ(k) has been calculated according to this process for a given value of k, the corrected signal is produced by applying this correction factor to the complex conjugate of all the samples processed in this block or burst of the received signal as follows:

$$Y(n)=X(n)-\hat{c}(k)X^*(n) \text{ for } n=1 \text{ to } N \quad (14)$$

In a dynamic environment (e.g. where the power of the received signal changes over time) it is necessary to continuously evaluate ĉ(k). Then the algorithm will continue indefinitely (at least until terminated by an external process), in which case ĉ(k) will be evaluated for ever-increasing values of k. However, this is not necessary for static environments. Therefore, in an alternative implementation of the algorithm, an integer L is set which stipulates the number of iterations which the algorithm will pass through.

In this alternate implementation, instead of the process passing from block 122 back to 112, the process passes to block 132 to check whether k equals L. If so, the algorithm will terminate at block 134; if not, the algorithm will return to block 112 and pass through a further iteration.

Instead of performing the iteration a certain number of times, in an alternative embodiment (not shown in the Figures) the algorithm is terminated when the correction factor is sufficiently similar to the correction factor calculated for a previous iteration. In this implementation, the block 132 of FIG. 6 is replaced with a process step where the value of ĉ(k) is compared to the value of ĉ(k−1). As the correction factor has an imaginary value, the comparison is made with the normal value. If $\|\hat{c}(k)-\hat{c}(k-1)\|>T$, the process will return to block 112 to perform a further iteration. If $\|\hat{c}(k)-\hat{c}(k-1)\|\leq T$, the process will terminate at block 132. The value of T may be set according to a desired accuracy for the IQ alignment process and is typically set to a value not much greater than 0.

An alternative approach is to consider the properties of the signal which has undergone alignment Y. As this signal has undergone alignment, the I- and Q-parts thereof are orthogonal so that:

$$E[Y_I Y_Q]=0 \quad (15)$$

Furthermore, the I- and Q-parts of the aligned signal Y are normalised so that:

$$E[Y_I^2]-E[Y_Q^2]=0 \quad (16)$$

Equations (15) and (16) represent the real and imaginary parts of $E[Y^2]$, so:

$$E[Y^2]=0 \quad (17)$$

Hence, the residual error, $\Delta c'$ in the aligned signal may be expressed as $$\Delta c' \propto \frac{E[Y^2]}{2E[|Y|^2]} \quad (18)$$

Then adaptation is simplified to changing the estimated correction factor ĉ' in the direction of the gradient $\Delta\hat{c}'$:

$$\hat{c}'(n)=\hat{c}'(n-1)+\mu'\Delta\hat{c}'(n) \quad (19)$$

provided the multiplicative factor μ' is sufficiently small for the algorithm to converge. Since it is the properties of the aligned signal Y which are considered here, this iteration is applied in a feed back manner. The considerations relating to the choice of value of the multiplicative factor mentioned above apply equally in this case.

Again, considering block-based adaptation where ĉ' is only updated every N samples, equation (19) is expressed as:

$$\hat{c}'(k)=\hat{c}'(k-1)+\mu'\Delta\hat{c}'(k) \quad (20)$$

for k>1 where the error factor $\Delta\hat{c}'(k)$ is defined as:

$$\Delta\hat{c}'(k) = \frac{\sum_{n=N(k-1)+1}^{Nk} Y^2(n)}{2\sum_{n=N(k-1)+1}^{Nk} |Y(n)|^2} \quad (21)$$

The denominator of equation (21) is the normalisation factor and is similar to the denominator of equation (13) derived in the feed forward scenario. Again, the factor N ordinarily used to calculate the averages will cancel out of the denominator and numerator of equation (21).

However, in certain situations, where the gain variations are small it is possible to determine the correction factor in this feed back scenario without explicitly including the normalisation in the evaluation. Then the gain normalisation is not explicitly evaluated in each iteration and is instead implicitly included in the multiplicative factor μ of equation (19), as is the factor N required for evaluation of the average squared signal. In this case, the error factor will be evaluated according to:

$$\Delta\hat{c}'(k) = \sum_{n=N(k-1)+1}^{Nk} Y^2(n) \quad (22)$$

Figure 7:
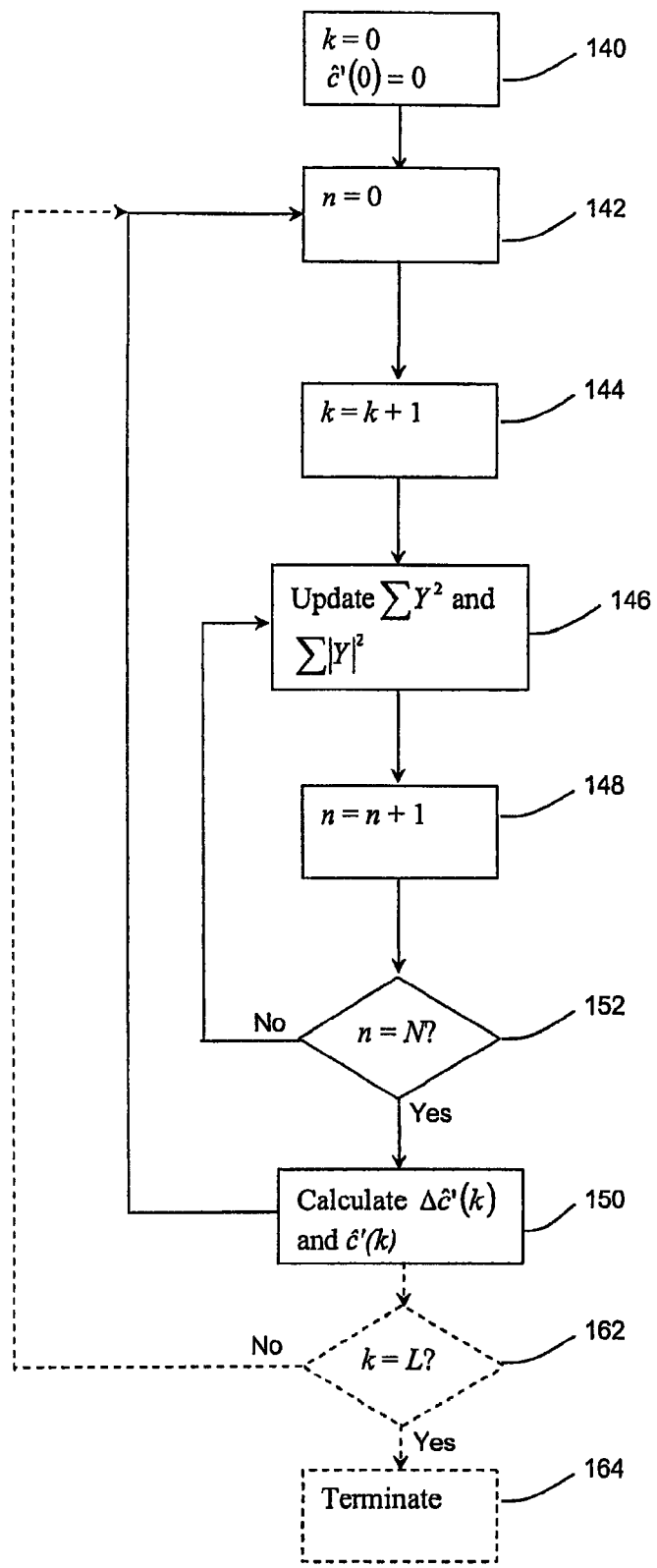
FIG. 7 is a flow diagram representing the operation of a further embodiment of the invention operating in a feedback manner.

FIG. 7 is a flow diagram representing the algorithm of equations (20) and (21) implemented by a processor in the IQ alignment device 72 illustrated in FIG. 4. As inputs to the algorithm, the values of N, the number of samples over which the signal is averaged according to equation (21) and μ', the multiplicative factor of equation (20), are set.

Block 140 represents an initialisation of the process in which the values of k and the initial value of the correction factor c'(0) are set to zero. Once the initialisation has been completed, the process moves to block 142 where the value of variable n is also set to zero. In the next block, block 144, the value of k is incremented. In block 146 the numerator and denominator of equation (21) are updated for the new sample Y(n) for the current value of n.

The process then moves to block 148 where the value of n is incremented. In block 152 the value of n is compared to N. If n is less than N, the process will return to block 146 to update the numerator and denominator of equation (21) for the now-incremented value of n. If n=N, the process will move to block 150 where the value of $\Delta\hat{c}'(k)$ will be evaluated according to equation (21) for n=N and this value used to calculate the value of $\hat{c}'(k)$ according to equation (20). The algorithm then returns to block 142 for a new iteration.

For each value of k greater than 1, all of the samples of this block or burst of aligned signal Y will be updated with the value of the calculated correction factor $\hat{c}'(k)$ according to:

$$Y(n)=X(n)-\hat{c}'(k)X^*(n) \text{ for } n=1 \text{ to } N \quad (23)$$

As for the implementation of the feed forward algorithm of equations (12) and (13), the above feed back algorithm may be implemented by defining a parameter L which sets the number of iterations the algorithm will pass through before terminating. In this implementation, represented by dashed lines in FIG. 7, the process will pass to block 162 after block 150 to determine whether k=L. If this is true, the process will terminate at block 164 and if false, the process will return to block 142. Alternatively, the number of iterations may be limited by comparing the normal value of a difference between the correction factors of successive iterations to a predetermined value T' (in a similar manner to that described above with reference to FIG. 6).

Alternatively, the error factor may be evaluated according to equation (22). In this instance, the suitable changes may be made to the algorithm described above with reference to FIG. 7, in which case block 146 will represent the evaluation of $\Sigma Y^2$.

Referring back to equations (13) and (21) or (22), it is to be realised that the evaluation of these equations can be separated into an evaluation of the real part and an evaluation of the imaginary part. As the real part of these equations will be related to the amplitude, and the imaginary part to the phase, of the averaged signal, these two properties can be dealt with separately.

Therefore, the evaluation of these equations may be simplified for certain modulation schemes. For example, in QPSK, variations in the amplitudes of different received symbols can be ignored. It is therefore sufficient to only consider the imaginary part of equations (13) and (21) or (22) when implementing the algorithm of embodiments of the invention in such a system. Similarly, if a modulation scheme is used in which errors in the phase do not affect demodulation, it is sufficient to only consider the numerator in equation (13). Evaluating only the imaginary or the real part of the error halves the complexity of evaluating the numerator of equations (13) and (21).

Figure 8:
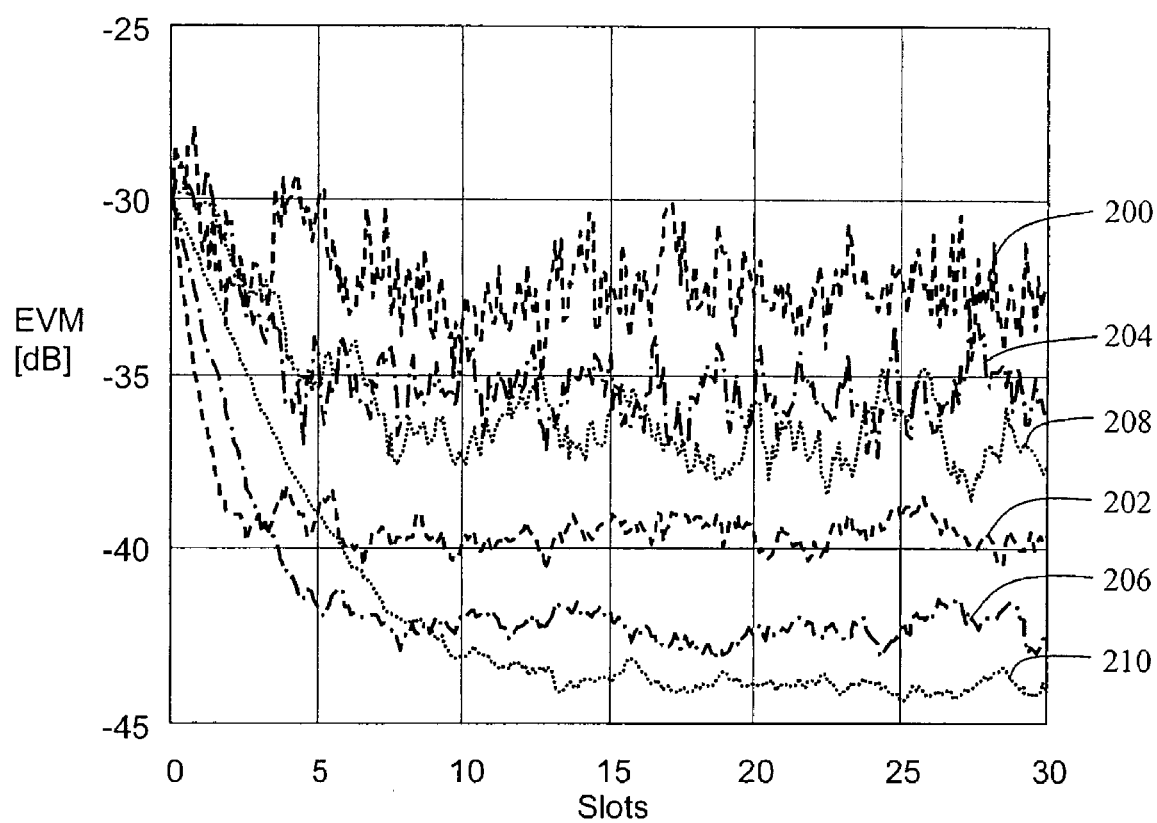
FIG. 8 is a graph of a simulation of an embodiment of the invention.

FIG. 8 is a graph representing the results of computer simulations of an embodiment of the invention operating in the feed back manner. For the purposes of this simulation, IQ misalignment in a received signal was simulated and white Gaussian noise was added to a known signal. The graph of FIG. 8 represents the results from 100 simulations in which a band-limited ($f<\frac{1}{4}f_s$) white Gaussian noise with a signal to noise ratio of 10 dB was added to a signal of uniformly distributed random data with a bandwidth of $f_s/4$ where $f_s$ is the sampling frequency. For these simulations, the value of N, the integration length, was set to 1024 samples.

The graph of FIG. 8 illustrates the average and maximum Error Vector Magnitudes (EVM) of the simulations for three different values for the multiplicative factor μ. Line 200 represents the maximum EVMs for $\mu=2^{-4}$ and line 202 the average EVM for this value of μ. Lines 204 and 206 represent the maximum and average EVMs respectively, for $\mu=2^{-5}$, whereas lines 208 and 210 represent the maximum and average EVMs respectively, for $\mu=2^{-6}$.

As illustrated by the graph of FIG. 8, a higher value for μ results in a faster convergence, but a greater residual EVM. For these simulations, the value of μ of $2^{-5}$ resulted in satisfactory performance. It is to be realised however that the value of μ will depend on the sampling frequency and the value of the integration length N of a particular implementation as well as factors attributable to the operating environment such as operating temperature and equipment age.

The signal to noise ratio (SNR) will affect the performance of algorithms of embodiments of the invention. In the aforementioned simulations as illustrated in FIG. 8, it was found that an SNR of about 5 dB or upwards provides sufficient performance for those simulations. This is well within the characteristics of IQ misalignment encountered in practice.

As stated, the specific implementation of embodiments of the invention will depend on a number of factors such as the operating environment of the receiver in which the algorithm is implemented (temperature, component age etc.).

Advantageously however, the parameters of the algorithms are adjustable and therefore embodiments of the invention may be implemented in many different environments. For example, embodiments of the invention may be used with one or more different mobile communications standards. Different standards employ differing modulation techniques with varying number of symbols in the corresponding constellation diagram.

For block-based IQ alignment, as implemented by embodiments of the invention, it is preferable that the alignment occur in between blocks, so as not to affect the data of a particular symbol. To accommodate this, the integration length N is set in dependence on the block length in a further embodiment.

For a system employing HSPDA, and assuming a sampling rate of four times the chip rate, a suitable integration length would be 1024 corresponding to $1/10^{th}$ of a slot which is the maximum symbol length. For other communications standards not dependent on data bursts, the integration length will be set equal to a fraction of the slot length.

Alternatively, where the signal is transmitted in bursts, for example in GSM, EDGE or GPRS, the integration length will be set equal to a burst of data which, for the example given, will be 156 symbols. Assuming a sampling rate equal to half the chip rate, a burst of data will be 1077 samples. Therefore, for such a system, the integration length N would be set to 1077.

Where the integration length is relatively long, the difference in successive samples may be small. In such a situation, a parameter M is set defining the sample period between integration samples. Referring back to FIGS. 6 and 7, where the sample interval M is set greater than 1, the value of n is incremented every M samples in respective blocks 118 and 148.

The values of N, the integration length; M, the sample interval; $\mu$, the multiplicative factor and L, the number of iterations through which the algorithm will pass are therefore related to one another and the parameters of the modulation scheme of the incoming signal.

The following values for these parameters may be chosen:
N={128, 256, 512, 1024, 1077, 2048, 4096, 8192}
M={1, 2, 4, 8, 16, 32, 64, 128}
$\mu$={0.015625, 0.03125, 0.0625, 0.125, 0.25, 0.5, 1}
L={∞, 1, 2, 4, 8, 16, 32, 64}

It is to be realised however that the above values of these parameters are given by way of example only and that the values used for any given implementation of embodiments of the invention will depend on the specifics of that implementation. Furthermore, as these parameters are set during initialisation, an algorithm according to an embodiment of the invention may be implemented in a quadrature receiver capable of receiving signals employing differing modulation schemes. The I- and Q-signals of a particular modulation scheme may then be aligned by the algorithm provided the corresponding values for these parameters are set.

Figure 9:
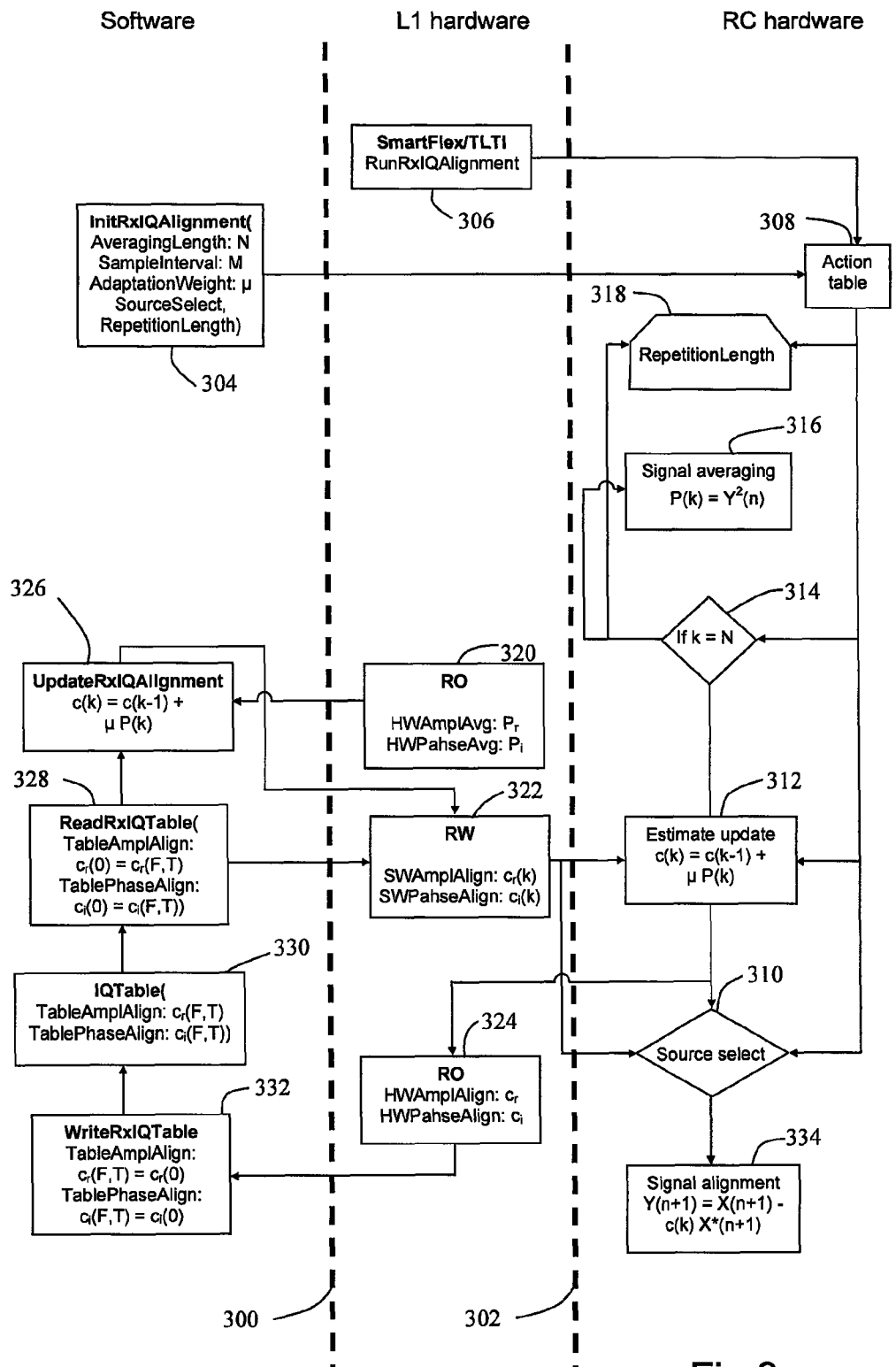
FIG. 9 is a flow diagram representing the operation of a further embodiment of the invention.

FIG. 9 illustrates an implementation of an embodiment of the invention for a particular hardware and software partitioning of a receiver. Line 300 depicts the division between software and a first hardware type and line 302 the division between the first hardware type and a second hardware type. In the embodiment illustrated, the first hardware type (L1) is a higher level system in charge of communications with the network whereas the second hardware type (RC) is a lower level system controlling the RF components of the receiver.

Block 304 depicts the initialisation of the algorithm in software and block 306 the initialisation in hardware. The parameters N, M, $\mu$ and L, as well as an indication of which source is to be selected (as explained below) are set as runtime parameters in the software initialisation 304. The software and hardware initialisations 304 and 306 act on the RC hardware action table 308 which controls the running of the process after initialisation.

Blocks 312, 314, 316 and 318 represent the hardware implementation of the feed back algorithm as described above with reference to FIG. 7. Therefore, a value of the correction factor c'(k) will be derived at block 312, based on the value derived in a previous iteration, c'(k−1). The real and the imaginary parts of ĉ'(k) are written to IQ table 330 by means of hardware register 324 and software process 332.

At block 316, P(k), the average value of $Y^2(n)$, has been calculated for n ranging over the set integration length N. The real and imaginary parts of P(k) are used by software process 326 via register 320, together with the real and imaginary parts of c'(k−1) read from IQ table 330 by software process 328, to calculate a value for c'(k) which may be utilised by the hardware at block 312 or at the source select decision block 310. Once c'(k) has been established, this is used to align the signal in block 334 in the manner previously described.

The IQ table 330 further stores initial values for c'(k), i.e. c'(0) which are set according to current operating parameters. As described above, the first time that the algorithm is run, the value of c'(0) will be sent to 0. However, certain events will trigger the storage of the current value of c'(k) for later use. For example, where the receiver receives signals having different carrier frequencies, a change in carrier frequency will cause the storage of the current value of c'(k). Once the carrier frequency value switches back, the stored value of c'(k) will be utilised as the value of c'(0). This is described in greater detail below with reference to FIG. 10.

Therefore, the action table 308 sets the source, via source select decision block 310, to determine whether c'(k) is updated by processes occurring only in hardware or those occurring in both hardware and software.

In this manner computationally intensive operations such as signal averaging (blocks 314, 316 and 318) and the alignment process (block 334) are performed by hardware and less complex operations are performed by software. The embodiment illustrated in FIG. 9 utilises the aforementioned feed back embodiment of the invention. However, similar hardware and software partitioning may be applied to an implementation of the feed forward embodiment of the invention In the aforementioned embodiments described with reference to FIGS. 6 and 7, the initial values of the correction factors ĉ(0) and ĉ'(0) were set to zero. However, as described above with reference to FIG. 9, the initial value for the correction factor may be loaded from memory.

Figure 10:
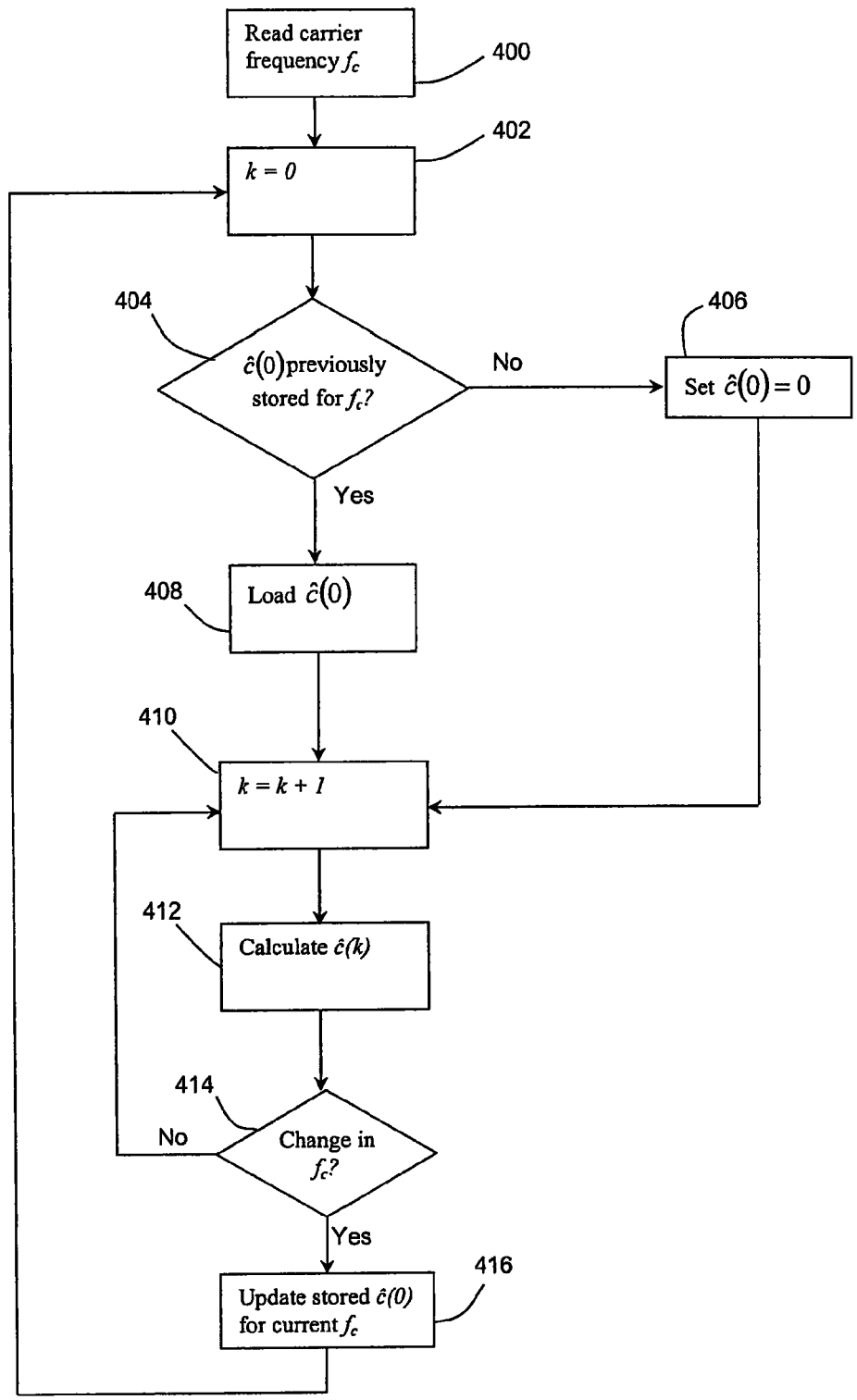
FIG. 10 is a flow diagram representing the operation of a further embodiment of the invention.

FIG. 10 illustrates a flow diagram of an embodiment of the invention and depicts a process whereby the initial value of the correction factor is loaded from, and to, memory. It is to be realised that this applies to any method of iteratively updating a correction factor ĉ(k) (for iteration k) used to correct misalignment in I- and Q-signals, whether by the method herein described or by any other iterative method.

In FIG. 10, the process begins at step 400 where the frequency $f_c$ of the carrier signal is determined. Although the process of FIG. 10 is illustrated and described with reference to the carrier signal frequency, it will be realised that this process is equally applicable to any other operational parameter influencing IQ alignment (e.g. amplification, sampling frequency or operating temperature).

Once the frequency $f_c$ of the carrier signal is determined, the process proceeds to step 402 where the value of k is set to zero. This corresponds to the first iteration. It is then determined, in block 404, whether or not a correction factor for the first iteration ĉ(0) has been previously stored for the current carrier frequency. The memory 80 of IQ alignment device 76 stores a table where a correlation between stored values of ĉ(0) and $f_c$ are maintained. Therefore, in step 404, the processor 78 of IQ alignment device 76 will query this table to determine if a value for ĉ(0) is stored for the measured value of $f_c$. If there is no such stored value, the process proceeds to step 406 where ĉ(0) is set to zero. If there is a stored value for ĉ(0), at step 408 the stored value is retrieved and assigned.

At step 410, the value of k is incremented, signifying the following iteration in the process. The process then, in step 412, calculates the correction factor ĉ(k) for the now-incremented value of k and applies this to perform IQ alignment. At step 414, the system determines whether the frequency $f_c$ of the carrier signal has altered (the degree of change required being preset or, alternatively, set by the user). If not, the process will return to block 410 and perform IQ alignment for the next iteration.

However, if the system determines at block 414 that the value of $f_c$ has changed, the process will move on to block 416. Here, the system will determine whether or not a value for ĉ(0) has previously been stored for the new value of $f_c$. If no such value has previously been stored, the process will set the value of ĉ(0) for the new $f_c$ as zero and return to block 402.

At block 416 the current value of ĉ(k) will be stored in a table in the memory 80 of the IQ alignment device 76 as the value of ĉ(0) corresponding to the current value of $f_c$ (i.e. the value prior to the change) so that when the carrier frequency returns to this current value of $f_c$, the stored value can be retrieved (in block 404) and the iterative alignment of the signal restarted from the value previously achieved.

The process will then return to block 402 to repeat the process for the changed value of $f_c$.

As indicated above, the aforementioned process for storing and loading correction factors for particular frequencies of the carrier signal can equally be applied to other operating parameters. In this case, the receiver includes appropriate sensors to monitor the relevant operating parameters.

The invention claimed is:

1. A method for correcting a misalignment between an I-signal and a Q-signal in a received signal, the method comprising the steps of:
   (a) determining an error factor based on a squared signal;
   (b) determining a correction factor based on the error factor; and
   (c) applying the correction factor to the received signal to produce a corrected signal, wherein the correction factor is applied to a complex conjugate of the received signal and the result thereof subtracted from the received signal to produce the corrected signal;
   wherein the correction factor includes a normalisation.

2. The method according to claim 1 wherein the normalisation is based on a squared magnitude of the signal.

3. The method according to claim 1 wherein step (a) includes the step of deriving an average of the squared signal.

4. The method according to claim 3 wherein step (a) includes the step of summing the squared signal over an integration length, said integration length comprising a predetermined number of samples.

5. The method according to claim 4 wherein the integration length is dependent upon a block length or on a burst length of the received signal.

6. The method according to claim 4 wherein the determination of the correction factor is dependent on the integration length.

7. The method according to claim 3 wherein step (a) includes the step of adding every $m^{th}$ sample wherein m is equal to, or greater than one, to determine the average squared signal.

8. The method according to claim 1 wherein step (a) comprises the step of evaluating only a real or an imaginary part of the squared signal.

9. The method according to claim 1 wherein step (a) includes the step of evaluating a real and an imaginary parts of the squared signal separately.

10. The method according to claim 1 wherein the correction factor is iteratively updated.

11. The method according to claim 10 wherein the correction factor is iteratively updated until a correction factor of an iteration is sufficiently similar to a correction factor of a previous iteration.

12. The method according to claim 11 wherein the correction factor is iteratively updated until normal value of a difference between a correction factor of an iteration and a correction factor of a previous iteration is less than a predetermined value.

13. The method according to claim 10 wherein the correction factor is updated for a predetermined number of iterations.

14. The method according to claim 10 wherein the correction factor of a particular iteration is based on the correction factor of a previous iteration and a re-evaluated error factor.

15. The method according to claim 14 wherein the correction factor of the particular iteration is related to the correction factor of a previous iteration by a multiplicative factor and wherein said multiplicative factor is dependent on one or more of: an operating environment, an integration length and a signal amplification.

16. The method according to claim 15 wherein said multiplicative factor is dependent upon the operating environment and compensates for variations attributable to one or more of: operating temperature, equipment age and sampling frequency.

17. The method according to claim 15 wherein said squared signal is a square of an incoming signal and said iteration is applied in a feed forward manner.

18. The method according to claim 17 wherein said correction factor for a particular iteration ĉ(k) is updated according to:

$$ĉ(k)=(1-\mu)ĉ(k-1)+\mu\Delta ĉ(k)$$

where $\mu$ is the multiplicative factor and $\Delta ĉ(k)$ is the error factor.

19. The method according to claim 18 wherein the error factor $\Delta ĉ(k)$ is evaluated according to:

$$\Delta ĉ(k) = \frac{\sum_{n=N(k-1)+1}^{Nk} X^2(n)}{2\sum_{n=N(k-1)+1}^{Nk} |X(n)|^2}$$

where X is the received signal and N is an integration length.

20. The method according to claim 15 wherein said squared signal is a square of an aligned signal and said iteration is applied in a feed back manner.

21. The method according to claim 20 wherein the correction factor for a particular iteration ĉ(k) is evaluated according to:

$$ĉ(k)=ĉ'(k-1)+\mu'\Delta ĉ'(k)$$

where $\mu'$ is the multiplicative factor and $\Delta ĉ'(k)$ is the error factor.

22. The method according to claim 21 wherein the error factor $\Delta\hat{c}'(k)$ is evaluated according to:

$$\Delta\hat{c}'(k) = \frac{\sum_{n=N(k-1)+1}^{Nk} Y^2(n)}{2\sum_{n=N(k-1)+1}^{Nk} |Y(n)|^2}$$

where Y is the aligned signal and N is an integration length.

23. The method according to claim 21 wherein the error factor $\Delta\hat{c}(k)$ is evaluated according to:

$$\Delta\hat{c}'(k) = \sum_{n=N(k-1)+1}^{Nk} Y^2(n)$$

where Y is the aligned signal and N is an integration length.

24. The method according to claim 1 which includes the step of establishing a correlation between said determined correction factor and one or more operational parameters and storing said determined correction factor for future use.

25. A method of correcting a misalignment between an I-signal and a Q-signal in a received signal which includes the steps of:

(a) determining a correction factor based on the misalignment between said I-signal and said Q-signal;
(b) applying the correction factor to the received signal to produce a corrected signal, wherein the correction factor is a applied to a complex conjugate of the received signal and the result thereof subtracted from the received signal to produce the corrected signal;
(c) establishing a correlation between said determined correction factor and one or more operational parameters; and
(d) storing said determined correction factor and said one or more correlated operational parameters for future use.

26. The method according to claim 24 further comprising the steps of:
monitoring one or more operational parameters and, on detection of a change in said operational parameter, using a previously stored correction factor to produce said corrected signal.

27. The method according to claim 24 wherein said one or more operational parameters includes one or more of: a signal frequency, a signal amplification, a sampling frequency, or an operating temperature.

28. Means for correcting a misalignment between an I-signal and a Q-signal in a received signal adapted to perform the method according to claim 1.

29. A quadrature receiver comprising means for correcting a misalignment between an I-signal and a Q-signal in a received signal according to claim 28.

* * * * *

UNITED STATES PATENT AND TRADEMARK OFFICE
CERTIFICATE OF CORRECTION

| | | |
|---|---|---|
| PATENT NO. | : 8,442,156 B2 | Page 1 of 1 |
| APPLICATION NO. | : 12/328260 | |
| DATED | : May 14, 2013 | |
| INVENTOR(S) | : Astrom et al. | |

It is certified that error appears in the above-identified patent and that said Letters Patent is hereby corrected as shown below:

On the Title Page, in Column 1, below "Prior Publication Data", insert
-- (30) Foreign Application Priority Data
Dec. 6, 2007 (GB) ........ 0723892.6 --.

On the Title Page, in Item (56), under "FOREIGN PATENT DOCUMENTS"
in Column 2, Line 1, delete "7/1998" and insert -- 11/2005 --, therefor.

In the Specification

In Column 1, Line 62, delete "$\cos(2f_c t)$" and insert -- $\cos(2\pi f_c t)$ --, therefor.

In Column 9, Line 58, in Equation (23), delete " $X(n) - \hat{c}'(k) X^*(n)$ " and insert -- $X(n) - c'(k) X^*(n)$ --, therefor.

In the Claims

In Column 14, Line 62, in Claim 21, delete " $\hat{c}(k)$ " and insert -- $\hat{c}'(k)$ --, therefor.

In Column 14, Line 64, in Claim 21, delete " $\hat{c}(k) =$ " and insert -- $\hat{c}'(k) =$ --, therefor.

In Column 15, Line 13, in Claim 23, delete " $\Delta \hat{c}(k)$ " and insert -- $\Delta \hat{c}'(k)$ --, therefor.

In Column 16, Line 5, in Claim 25, delete "is a applied" and insert -- is applied --, therefor.

Signed and Sealed this
Third Day of December, 2013

Margaret A. Focarino
*Commissioner for Patents of the United States Patent and Trademark Office*